US011953570B2

United States Patent
Wikus

(10) Patent No.: US 11,953,570 B2
(45) Date of Patent: Apr. 9, 2024

(54) NMR MEASURING ASSEMBLY WITH COLD BORE OF THE CRYOSTAT

(71) Applicant: Bruker Switzerland AG, Faellanden (CH)

(72) Inventor: Patrick Wikus, Nuerensdorf (CH)

(73) Assignee: BRUKER SWITZERLAND AG, Faellanden (CH)

( * ) Notice: Subject to any disclaimer, the term of this patent is extended or adjusted under 35 U.S.C. 154(b) by 0 days.

(21) Appl. No.: 17/882,192

(22) Filed: Aug. 5, 2022

(65) Prior Publication Data

US 2022/0373625 A1 Nov. 24, 2022

Related U.S. Application Data

(63) Continuation of application No. PCT/EP2021/051732, filed on Jan. 26, 2021.

(30) Foreign Application Priority Data

Feb. 7, 2020 (DE) ...................... 10 2020 201 522.8

(51) Int. Cl.
  *G01R 33/38* (2006.01)
  *G01R 33/3815* (2006.01)
(52) U.S. Cl.
  CPC ..... *G01R 33/3804* (2013.01); *G01R 33/3815* (2013.01)
(58) Field of Classification Search
  CPC ............ G01R 33/3804; G01R 33/3815; G01R 33/3875; G01R 33/383; G01R 33/46;

(Continued)

(56) References Cited

U.S. PATENT DOCUMENTS

| 5,220,800 A | 6/1993 | Mueller et al. |
| 5,966,944 A | 10/1999 | Inoue et al. |

(Continued)

FOREIGN PATENT DOCUMENTS

| DE | 102015212314 B3 | 10/2016 |
| DE | 102016207846 B3 | 7/2017 |

(Continued)

OTHER PUBLICATIONS

S. Chen, Y. Dai, B. Zhao, Y. Li, H. Wang and K. Chang, "Development of an 8-T Conduction—Cooled Superconducting Magnet With 300-mm Warm Bore for Material Processing Application," in IEEE Transactions on Applied Superconductivity, vol. 24, No. 2, pp. 72-76, Apr. 2014 (Year: 2014).*

(Continued)

*Primary Examiner* — Daniel R Miller
(74) *Attorney, Agent, or Firm* — Edell, Shapiro & Finnan, LLC

(57) ABSTRACT

An NMR measuring arrangement (20) includes a cryostat (1), a superconducting magnet coil system (2) and an NMR probe (3). The cryostat has an evacuated vacuum container (5) and forms a bore (10). A wall (12) of the bore delimits the vacuum container. The cryostat forms only one evacuated gap (13) in a space (18) between the magnet coil system and the wall of the bore. At least a segment of the wall of the bore is thermally coupled to a heat sink of the cryostat. As a result, the NMR measurement arrangement provides more precise NMR measurements (in particular with a higher spectral resolution and/or a higher signal-to-noise ratio) on measurement samples.

21 Claims, 8 Drawing Sheets

(58) Field of Classification Search
CPC ............. G01R 33/30; G01R 33/34092; G01R 33/387; G01R 33/44; H01F 6/04
See application file for complete search history.

(56) References Cited

U.S. PATENT DOCUMENTS

| | | | |
|---|---|---|---|
| 6,192,690 | B1 | 2/2001 | Stautner |
| 7,191,601 | B2 | 3/2007 | Atrey |
| 8,975,896 | B2 | 3/2015 | Schett et al. |
| 9,958,520 | B2 | 5/2018 | Schauwecker et al. |
| 10,060,998 | B2 | 8/2018 | Wikus et al. |
| 2005/0202976 | A1* | 9/2005 | Killoran ............. G01R 33/3815 505/200 |
| 2006/0021355 | A1 | 2/2006 | Boesel et al. |
| 2007/0096740 | A1 | 5/2007 | Fukuda et al. |
| 2012/0242335 | A1* | 9/2012 | Schett ................ G01R 33/3403 324/318 |
| 2015/0007586 | A1* | 1/2015 | Kraus ..................... F25B 9/002 62/51.1 |
| 2017/0002979 | A1 | 1/2017 | Wikus et al. |
| 2017/0322270 | A1 | 11/2017 | Wikus et al. |
| 2018/0045797 | A1 | 2/2018 | Hinderer et al. |
| 2018/0081011 | A1 | 3/2018 | Wikus et al. |

FOREIGN PATENT DOCUMENTS

| | | | | |
|---|---|---|---|---|
| DE | 102016214731 | B3 | 7/2017 | |
| DE | 102016214728 | B3 | 8/2017 | |
| DE | 102016218000 | B3 | 10/2017 | |
| EP | 1560035 | A1 | 8/2005 | |
| GB | 2492645 | A * | 1/2013 | ............ F17C 13/007 |
| JP | 2002219112 | A | 8/2002 | |
| JP | 2005214976 | A | 8/2005 | |
| JP | 2012198210 | A | 10/2012 | |
| JP | 2017125760 | A | 7/2017 | |
| JP | 2018021896 | A | 2/2018 | |
| JP | 2018071962 | A | 5/2018 | |

OTHER PUBLICATIONS

International Search Report, PCT/EP2021/051732, dated Apr. 19, 2021, 5 pages.
Japanese Office Action with English translation, Application No. 2022-534421, dated Aug. 22, 2023, 8 pages.
German Office Action, Application No. 10 2020 201 522.8, dated Dec. 3, 2020, 16 pages.
Japanese Office Action with English translation, Application No. 2022-534421, dated Jan. 15, 2024, 10 pages.

* cited by examiner

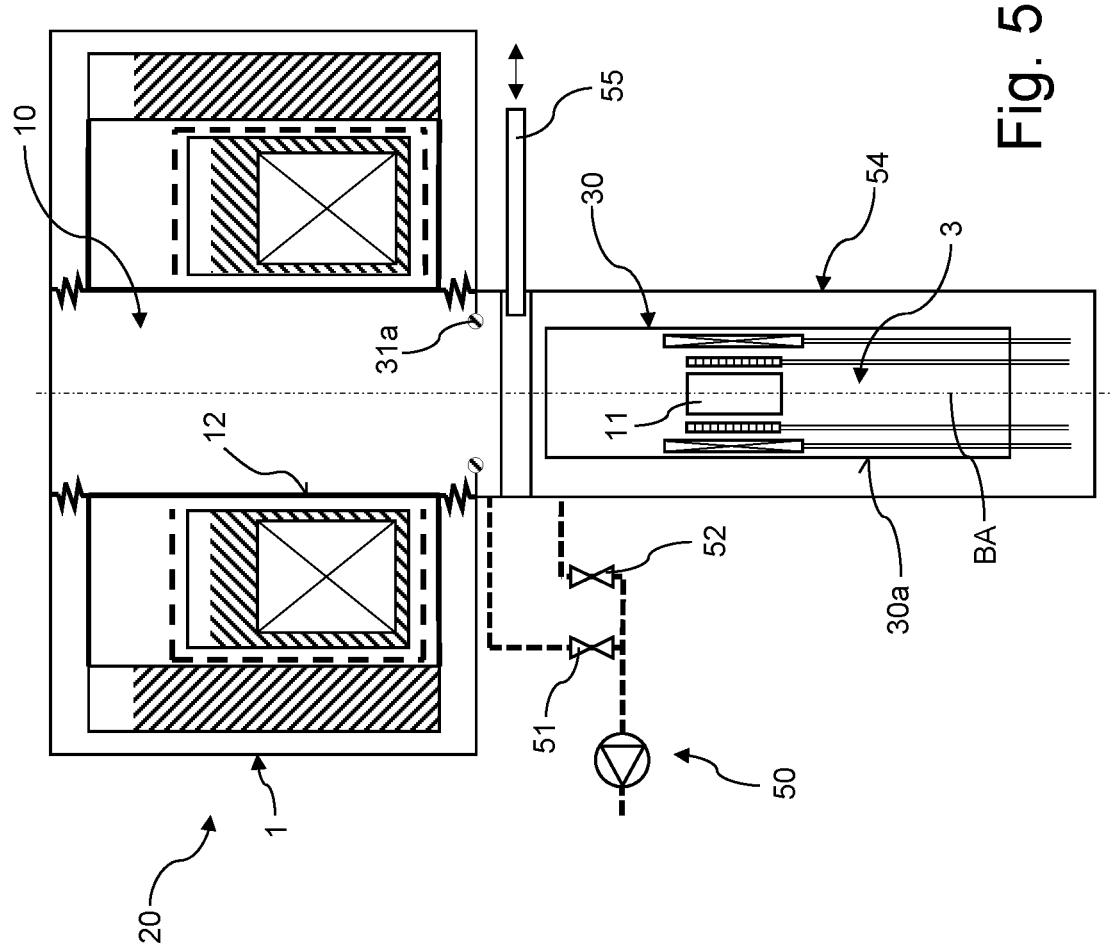

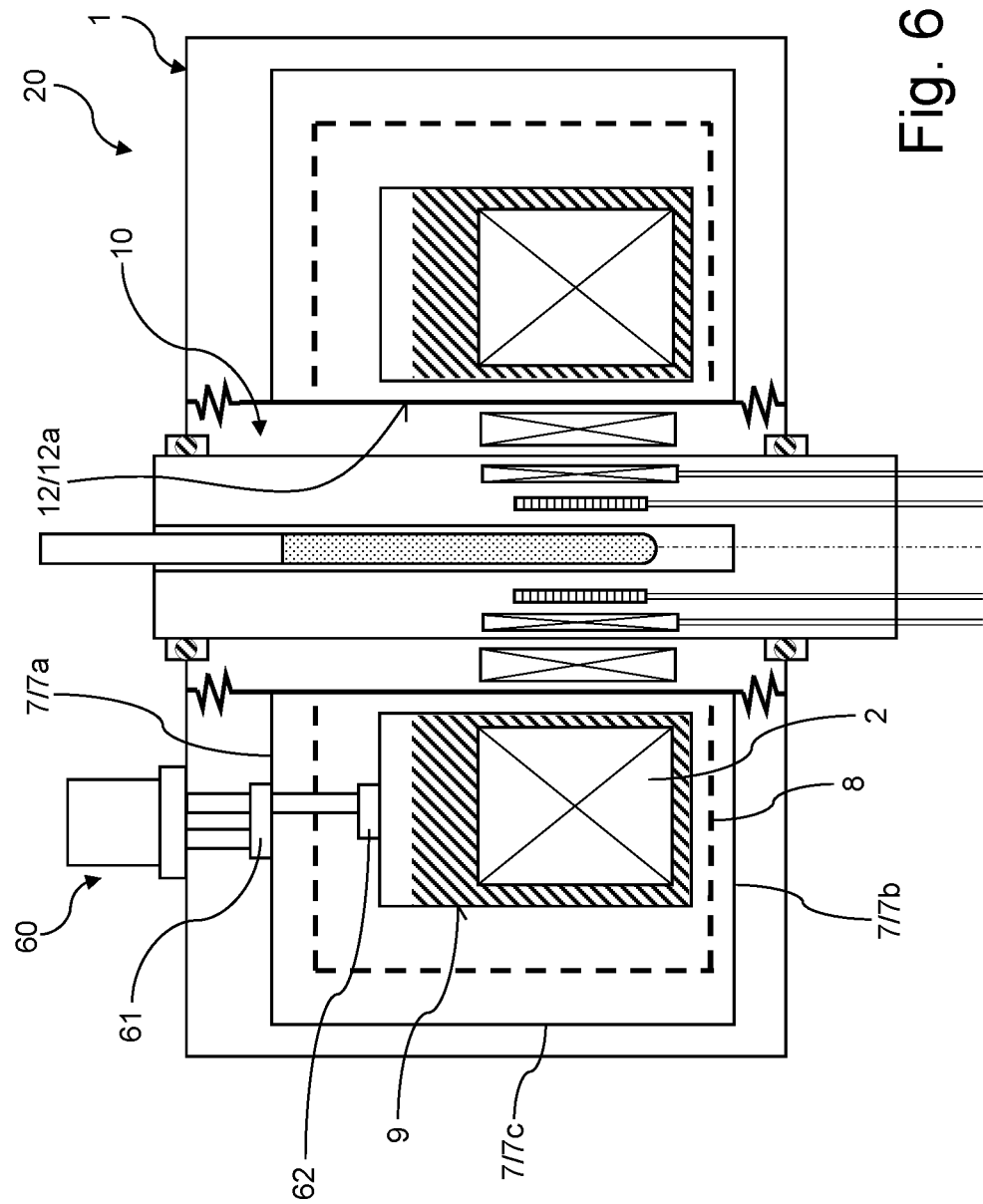

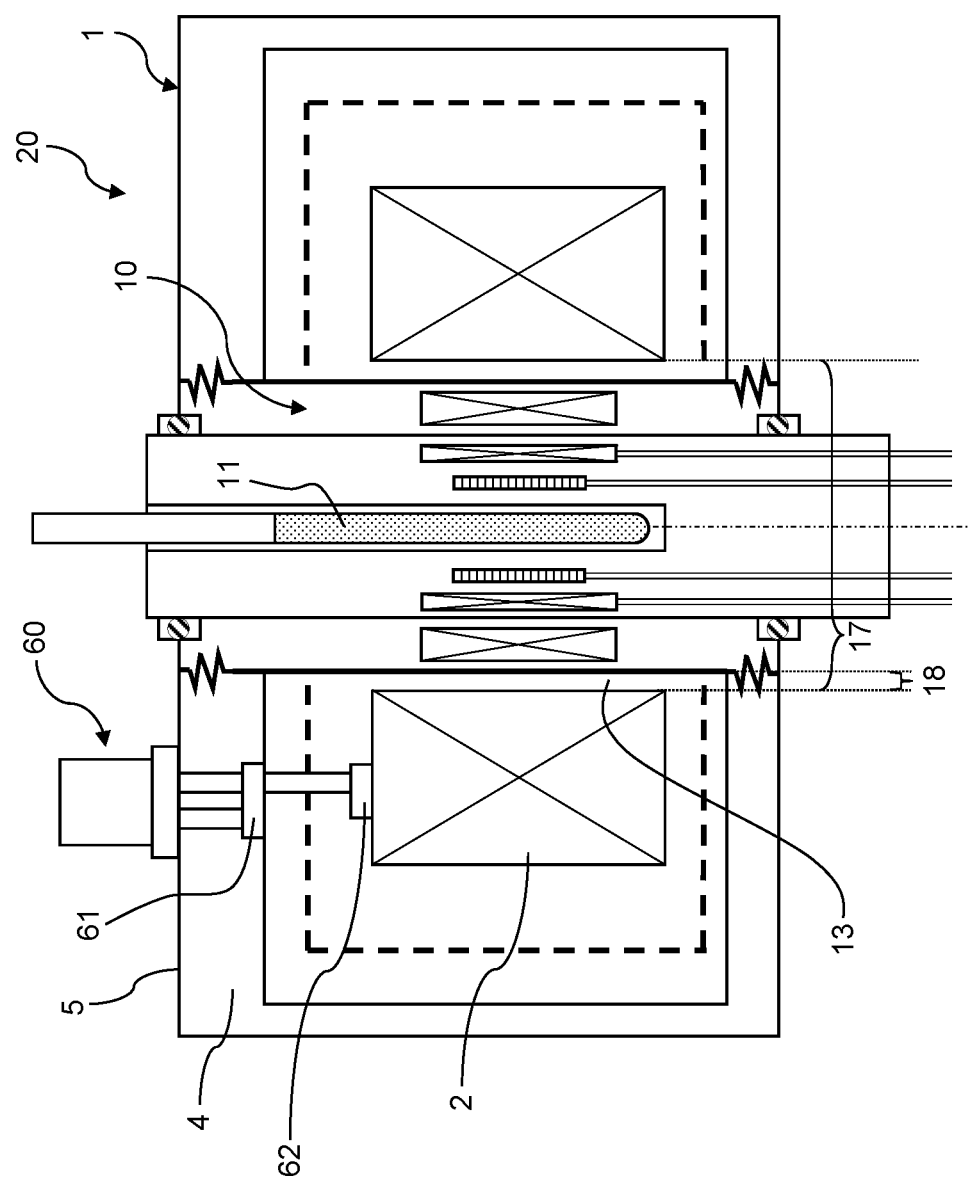

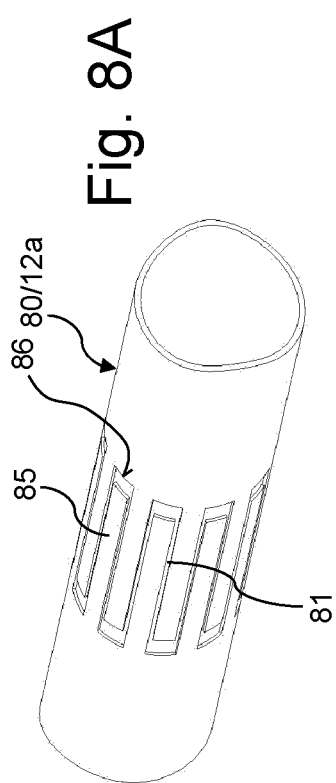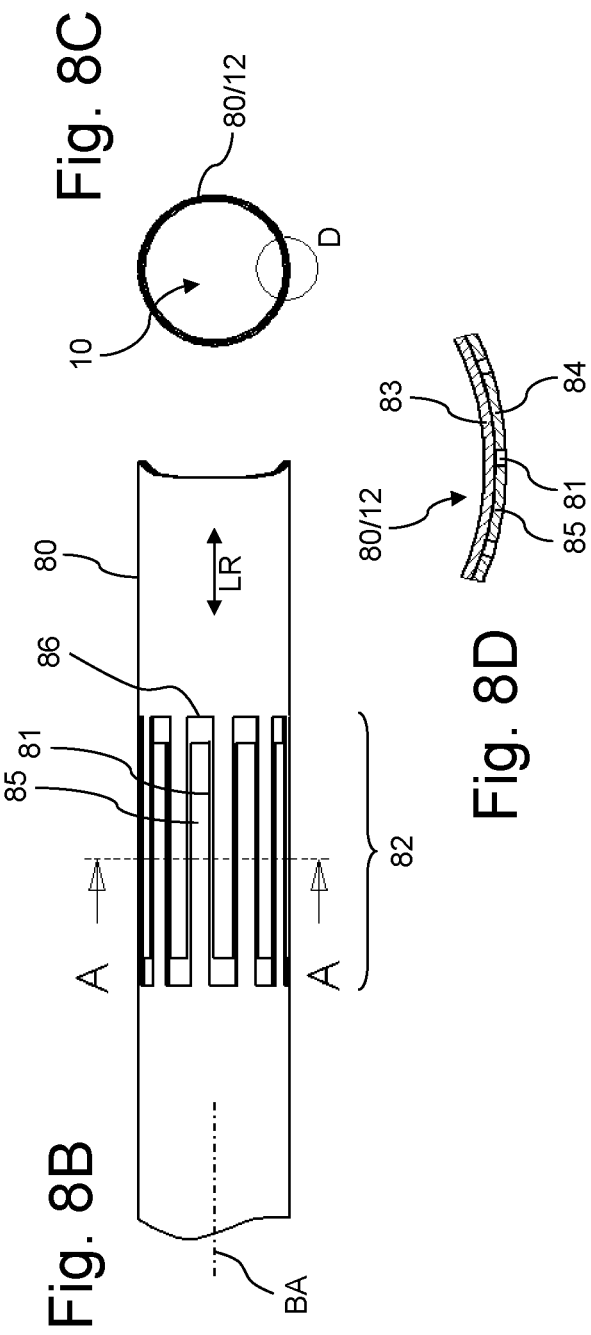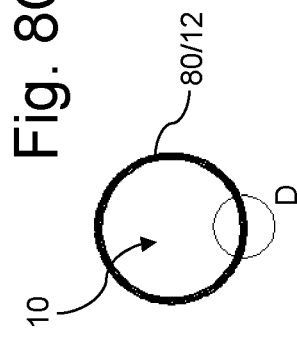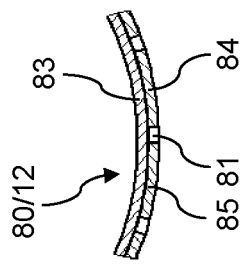

NMR MEASURING ASSEMBLY WITH COLD BORE OF THE CRYOSTAT

CROSS REFERENCE TO RELATED APPLICATIONS

This is a Continuation of International Application PCT/EP2021/051732, which has an international filing date of Jan. 26, 2021, the disclosure of which is incorporated in its entirety into the present Continuation by reference. This Continuation also claims foreign priority under 35 U.S.C. § 119(a)-(d) to German Application No. 10 2020 201 522.8 filed on Feb. 7, 2020, the entire contents of which are hereby incorporated into the present Continuation by reference.

FIELD OF THE INVENTION

The invention relates to an NMR measuring arrangement comprising
  a cryostat having an evacuated vacuum container, wherein the cryostat forms a bore, and wherein a wall of the bore also delimits the vacuum container,
  a superconducting magnetic coil system having a magnet bore, wherein the magnetic coil system is arranged directly or indirectly inside the vacuum container, wherein the cryostat, for the thermal insulation of the magnetic coil system, locally forms one or more evacuated gaps between the superconducting magnetic coil system and the vacuum container in a sequence from the inside out, and wherein the bore extends through the magnet bore,
  an NMR probe having an RF coil system, wherein the NMR probe is arranged outside the vacuum container, and wherein the NMR probe is at least partially arranged in the bore.

Such an NMR measuring arrangement is known, for example, from US 2006/0021355 A1.

BACKGROUND

Using nuclear magnetic resonance (=NMR) measurements, substances contained in a measurement sample can be examined qualitatively and quantitatively. The measurement sample is exposed to a static magnetic field and irradiated with radiofrequency (=RF) pulses, and the reaction of the measurement sample to the RF pulses is measured. For high accuracy of the NMR measurements, the static magnetic field should be homogeneous, stable over time and have the highest possible field strength.

Magnetic fields with high field strengths for NMR measurements are often generated with superconducting magnetic coil systems. For this purpose, the superconducting magnetic coil systems must be kept at a cryogenic temperature, for which the magnetic coil systems are typically arranged in a cryostat. A typical cryostat comprises a vacuum container, in the interior of which the magnetic coil system is arranged directly or indirectly, and the interior of which is evacuated for thermal insulation of the magnetic coil system from the environment. The magnetic coil system is usually designed as a solenoid with a magnet bore in which the sample volume for the measurement sample is formed centrally with a maximum magnetic field strength. The cryostat or the vacuum container forms a bore that runs through the magnet bore and through which the sample volume is accessible. An NMR probehead, which has at least one RF coil system, is arranged in, in particular inserted into, the bore of the cryostat in order to radiate RF pulses into the measurement sample and to read out the reaction of the measurement sample.

The vacuum container or its outer wall is exposed to the environment and accordingly approximately at room temperature. In order to minimize the heat input into the magnetic coil system by thermal radiation, the cryostat typically has one or more sheet metal radiation shields which are arranged between the vacuum container (or its outer wall) and the magnetic coil system. A vacuum is present on both sides of a sheet metal radiation shield for thermal insulation, and the sheet metal radiation shield is usually connected to a heat sink of the cryostat.

US 2006/0021355 A1 describes a cryostat in which a superconducting magnetic coil system is arranged in a cryogenic container filled with liquid helium, which is cooled by a coldest cooling stage of a cryocooler. The cryogenic container is surrounded on all sides, including towards the bore of the cryostat, by a sheet metal radiation shield which is thermally coupled to a warmer cooling stage of the cryocooler. The sheet metal radiation shield is in turn arranged in the vacuum container of the cryostat. The magnetic coil system can in particular be designed for high-resolution NMR.

With this design, the bore of the cryostat is approximately at room temperature and exposed to the ambient air, which facilitates the arrangement and the change of an NMR probe in the bore.

Comparable cryostats are also known from U.S. Pat. Nos. 5,220,800 A, 8,975,896 B2, and 6,192,690 B1, wherein an LN2 tank is arranged in the vacuum container of the cryostat, which cools a sheet metal radiation shield, wherein this sheet metal radiation shield runs between a helium-filled cryogenic container and the wall of the vacuum container, in particular in the region of the bore.

In order to improve the signal-to-noise ratio during the NMR measurements on the measurement sample, NMR probes are known in which the RF coils of the NMR probe are cooled with their own cooling device. The outer housing of the NMR probe can then be designed as a vacuum container for thermal insulation, cf., for example, US 2007/0096740 A1; this document also proposes the use of a radiation shield within the NMR probe.

Depending on the design, a multiplicity of components must or should be accommodated in the magnet bore of a superconducting magnetic coil system of an NMR measuring arrangement, in particular the NMR measurement sample (usually a sample tube filled with a measurement substance), channels for the temperature control of the measurement sample, gas channels for moving the measurement sample (e.g., for rotating the measurement sample during the measurement or in order to insert and remove the measurement sample), vacuum and gas barriers for thermal insulation of the measurement sample or the RF coil system, the RF coil system, heat exchangers and cooling elements for the RF coil system, a gradient coil system including any shielding for introducing gradient pulses onto the measurement sample, an electric shim coil system for homogenizing the static magnetic field, gas channels for cooling the shim coil system, passive shim elements, electrical supply lines to the RF coil system and to the shim coil system, and/or diagnostic sensors including supply lines (such as temperature sensors, magnetic field sensors, optical sensors for detecting the sample position). The more volume is available within the magnet bore for the measurement sample, or the closer the magnetic coil system can move to the measurement sample, the easier and cheaper it is to set up a high magnetic field strength on the measurement sample with the magnetic coil system. The higher the magnetic field strength, the more precise the NMR measurement signals (in particular with a higher spectral resolution and a higher signal-to-noise ratio) that can be obtained from the measurement sample.

From DE 10 2016 214 728 B3, an NMR apparatus is known which provides for the partial arrangement of an NMR probe in the interior of the vacuum container of a cryostat. A superconducting magnetic coil system is also arranged in the vacuum container of the cryostat. For this purpose, the vacuum container of the cryostat can be provided with a lock arrangement.

The disadvantage of the latter procedure is the risk of inadvertently breaking the vacuum of the vacuum container in which the superconducting magnetic coil arrangement for thermal insulation is also arranged when the probe is changed, which usually leads to a sudden increase in the heat load on the magnetic coil and consequently to a collapse of the superconductivity ("quench") on the superconducting magnetic coil system.

SUMMARY

It is an object of the invention to present an NMR measuring arrangement with which more precise NMR measurements (in particular with a higher spectral resolution and/or a higher signal-to-noise ratio) can be obtained on measurement samples.

DESCRIPTION OF THE INVENTION

According to one formulation of the invention, this object is achieved by an NMR measuring arrangement of the initially described type which is characterized in that the cryostat only forms one evacuated gap in the space between the magnetic coil system and the wall of the bore in a sequence from the inside out,
and that at least one segment of the wall of the bore is thermally coupled to a heat sink of the cryostat.

Within the scope of the present invention, it is provided that only one evacuated gap is provided in the space between the wall of the bore of the vacuum container and the magnetic coil system for thermal insulation.

In other words, no conventional sheet metal radiation shield (which is a sheet metal sheet surrounded by vacuum on both sides, usually with thermal coupling of the sheet metal to a heat sink of the cryostat) is formed in the space between the magnetic coil system and the wall of the bore. Instead, at the only one evacuated gap, the wall of the bore and the magnetic coil system or a cryogenic container filled with cryogenic fluid, in which the magnetic coil system is arranged, lie directly opposite one another. The wall of the bore thus delimits the only one evacuated gap.

A conventional sheet metal radiation shield, which would form an evacuated gap on each side of the sheet metal (i.e., a total of two evacuated gaps in sequence from the inside out), would require a comparatively large installation space for the two evacuated gaps (it must be noted that evacuated gaps must be large enough, so that, in all operating states and over the entire operating time of the cryostat, a thermal bridge through solid contact is excluded in order to ensure their insulating effect). Within the scope of the invention, this installation space can be partially saved and accordingly partially used to use a larger proportion of the volume inside the magnet bore for measuring the measurement sample (and in particular for the measurement sample itself) and to move the magnetic coil system closer to the measurement sample to be measured. As a result, the magnetic field generation by the magnetic coil system on the measurement sample is more efficient; in particular, under otherwise identical conditions (in particular at the same costs), higher magnetic field strengths can be set up on the measurement sample and correspondingly, more precise NMR measurements can be carried out within the scope of the invention on the measurement sample which is arranged in the bore together with the NMR probe.

Typically, the cryostat according to the invention has at least one sheet metal radiation shield between the vacuum container and the magnetic coil system, which is interrupted in the region of the space between the magnetic coil system and the wall of the bore. However, within the scope of the invention, if desired, one or more super-insulation blankets (such as a package of Al-coated, biaxially oriented polyester films) can be used in the space between the magnetic coil system and the wall of the bore, which, for example, cover the wall of the bore on the inside (on the vacuum side, radially outside).

Furthermore, it is provided within the scope of the invention that at least one segment of the wall of the bore of the vacuum container is coupled to a heat sink of the cryostat. During normal operation, the wall of the bore is thus cold at least in the region of this segment, in particular significantly colder than room temperature or the temperature of the environment. Due to the thermal coupling of at least the segment to the heat sink, the lack of a conventional sheet metal radiation shield in the region of the bore can be at least partially compensated for, and the heat input to the magnetic coil system can be limited within the scope of the invention to a technically manageable and economical level. The heat sink of the cryostat, to which at least the segment is thermally coupled, is thermally decoupled from the magnetic coil system, so that the heat input into the magnetic coil system is minimized.

In addition to the RF coil system, the NMR probe can also comprise a shim coil system, or a shim coil system is also arranged in the bore. The NMR probe can also comprise a gradient coil system, or a gradient coil system is also arranged in the bore. The fact that the NMR probe is arranged outside the vacuum container has the advantage that manipulations (e.g., a sample change, an adjustment or repair) on the NMR probe can be carried out relatively easily, and that in the event of any malfunctions on the NMR probe (e.g., leaks in gas-carrying components), the isolation vacuum in the cryostat for the magnetic coil system is not endangered. The NMR probe can comprise a sample holder. When the probe is changed, the NMR probe is preferably manageable as an integrated component and is, in particular, insertable into and removable from the bore, preferably in the axial direction.

The superconducting magnetic coil system can be arranged directly in the evacuated interior of the vacuum container (i.e., the magnetic coil system is directly exposed to the insulation vacuum in the vacuum container) or indirectly (i.e., in a cryogenic container arranged in the interior of the vacuum container and filled with a cryogenic fluid, usually helium, so that the magnetic coil system is exposed to this cryogenic fluid). The cryostat can comprise a further cryogenic container usually filled with liquid nitrogen.

The NMR measuring arrangement according to the invention is preferably designed for high-resolution NMR spectroscopy with a 1H resonance frequency of 1.2 GHz or higher. The superconducting magnetic coil system can comprise an HTS conductor, in particular a YBCO tape conductor, which is wound to a diameter of 70 mm or less.

The "sequence from the inside out" (via which the number of evacuated gaps is counted) generally refers to a (local) direction proceeding from the magnetic coil system (which lies "inside" the vacuum container) towards the vacuum container or its wall (wherein the vacuum container surrounds the magnetic coil system and therefore lies "outside" as seen from the magnetic coil system). In the aforementioned space between the magnetic coil system and the wall of the bore, the "sequence from the inside out" is thus, proceeding from the magnetic coil system, directed towards the bore, i.e., directed "radially inwardly."

Preferred embodiments of the NMR measuring arrangement according to the invention In a preferred embodiment of the NMR measuring arrangement according to the invention, it is provided that the wall of the bore also delimits a hermetically sealed space outside the vacuum container, with this sealed space extending in the bore in the longitudinal direction at least over the length of the segment. In other words, the bore is hermetically sealed against the environment and the evacuated space of the vacuum container at least in the region of the segment of the wall of the bore. As a result, it is possible to keep this sealed space free of moisture and to prevent or at least minimize the formation of condensation or even ice on the cold wall of the bore on the side facing away from the vacuum container. Typically, the hermetically sealed space is evacuated during normal operation or filled with a dry gas, preferably with an overpressure in relation to the environment, in order to impede penetration of ambient air in the event of a leak. If filled with dry gas, a constant overpressure is preferably set in the sealed space with respect to the environment, and if a gas inflow is necessary to maintain the constant overpressure, then this indicates a leak. While manipulations are being carried out on the probe (e.g., installation or removal), the hermetically sealed space can be opened and flushed with a dry gas. The sealed space is typically delimited together with further structures (such as a bore bottom or a sealing cover). In particular, the NMR probe can also delimit the sealed space; alternatively, the NMR probe can also be arranged entirely in the sealed space. Hermetic feedthroughs can be used for the electrical connections and any fluid connections of the NMR probe. The length of the segment relates to the longitudinal direction (axial direction along the bore axis).

In a preferred development of this embodiment, the wall of the bore and a housing wall of the NMR probe are sealed against one another with one or more seals, in particular radial seals. In combination with the (gas-tight) housing wall of the NMR probe and the seal or seals, the sealed space can be delimited in a simple manner. A housing of the NMR probe is often designed to be gas-tight overall; in other cases, only the housing walls facing the sealed space are designed to be gas-tight. A temporary opening of the sealed space is typically accepted during a probe change and usually accompanied by protective measures such as flushing with dry gas or temporary heating of the wall of the bore with a heating device in order to avoid the formation of condensation. After the installation of the NMR probe, the sealed space is, if necessary, first brought to the desired atmospheric conditions (in particular filled with dry gas or evacuated) before an NMR measurement is started. Radial seals allow the probe to be inserted (axially) without changing the atmospheric conditions in the sealed space.

In a further preferred development, a lock chamber is formed at an opening of the bore, through which the NMR probe is introduceable for an at least partial arrangement in the bore and dischargeable again. The sealed space or the bore is accessible via the lock chamber without changing the atmospheric conditions in the sealed space (usually vacuum or dry gas); the evacuated space can therefore be kept uninterrupted under the desired atmospheric conditions even when the probe is changed. As a result, the cold wall of the bore can be protected from the formation of condensation and a heat load on the heat sink coupled to the segment can also be avoided.

In an advantageous development, a pump device is provided with which the sealed space is evacuable. A vacuum in the sealed space or in the bore in front of its cold wall prevents the formation of condensation and also reduces the input of heat into the wall of the bore and thus to the superconducting magnetic coil system. If a lock chamber is present, it is preferably also evacuable with the pump device.

In a further advantageous development, a dry gas filling device is present with which the sealed space is fillable with a dry gas, in particular dry nitrogen or dry helium. The filling with dry gas is more cost-effective and easier than maintaining a vacuum, and it also avoids the formation of condensation. The filling with dry gas also helps to avoid the penetration of ambient air into the hermetically sealed space, in particular if the dry gas has an overpressure compared to the ambient air. In addition, a specific thermal coupling between the wall of the bore and components arranged in the bore (i.e., a cooling of these components), for example, parts of the probe, can be established via the dry gas, if desired. If a lock chamber is present, it is preferably also fillable with dry gas using the dry gas filling device. It must be noted that a dry gas filling device can often also be used as a dry gas flushing device with which the sealed space can be flushed with dry gas during opening, for example, when changing the probe.

In a further preferred embodiment, the cryostat is provided with a dry gas flushing device with which the bore can be flushed with a dry gas, in particular dry nitrogen or dry helium, at least in the region of the segment. By flushing at least the (cold) segment of the wall of the bore, the formation of condensation on this segment can be prevented. The dry gas flushing device is usually only used temporarily, typically when a sealed space of the bore has to be temporarily opened during a probe change; however, it is also possible to use the dry gas flushing device in normal operation during an NMR measurement on a measurement sample, in particular when the bore is open. In this case, it is ensured that the flow rate of the dry gas is kept as low as possible in order to minimize the thermal load on the cold bore wall, however, adequate protection against the formation of condensation and icing must be ensured at the same time.

In a further advantageous embodiment, the wall of the bore is provided with a heating device, in particular an electrical heating device, with which at least the segment of the wall of the bore is heatable, in particular wherein at least the segment of the wall on its side facing the environment is heatable with the heating device to a temperature of at least 10° C. By heating at least the segment of the wall of the bore with the heating device, a formation of condensation on this segment can be prevented; with a typical humidity in the environment of up to approximately 70%, heating to approximately 10° C. is sufficient to reliably prevent the formation of condensation. For this purpose, the heating device is only used temporarily, typically when a sealed space in the bore has to be temporarily opened during a probe change. The heating device can also be used to free the bore from condensation or ice if condensation or ice has formed, e.g., due to incorrect operation and/or a defect.

In a particularly preferred embodiment, at least the segment of the wall of the bore is thermally decoupled from the rest of the vacuum container. By (substantially) thermally decoupling the segment, the heat flow from the rest of the vacuum container into the segment and thus also the heat load on the heat sink, via which the segment is cooled, is reduced. This also ensures that no region of the rest of the vacuum container cools down excessively. This prevents condensation or ice from forming on the rest of the vacuum container (or outside the hermetically sealed region). The (substantial) thermal decoupling is typically designed such that the vacuum container does not cool down by more than 10 K below the ambient temperature in any region surrounded by ambient air due to the heat flow into the cold segment when the cold segment is at the operating temperature of its heat sink. The (substantial) thermal decoupling can also be designed such that the heat flow from the vacuum container into the cold segment is less than 20 W if the vacuum container and the cold segment have a temperature difference of 200 K (in particular if the vacuum container has a temperature of 300 K and the cold segment is kept at 100 K); the remaining thermal coupling is then correspondingly less than 0.1 W/K.

In a preferred development of this embodiment, the wall of the bore, in a central portion with respect to the longitudinal direction, is made from a material with a higher specific thermal conductivity and/or with a greater wall thickness than two outer portions. This structure makes it possible to keep the central portion (or at least the segment) evenly cold and to quickly dissipate any heat irradiation from radially inside, for example, from the probe, to the coupled heat sink. On the other hand, the axial input of heat from the vacuum container or its remaining wall is reduced. Central and outer portion refer to the longitudinal direction (axial direction) of the bore. If a portion of the wall of the bore is made of a plurality of materials, the material properties can be averaged. Typically, the remaining wall of the vacuum container is also made of a material with a higher specific thermal conductivity and/or with a greater wall thickness than the two outer portions. The outer portions can in particular be designed as corrugated bellows and/or made of stainless steel or contain stainless steel. A design as a corrugated bellows has the additional advantage that the distance relevant for heat conduction (the "thermal distance" between the cold segment and the vacuum container) is extended. The central portion can in particular be made of copper or contain copper. The thermal conductivity is compared at operating temperature of the wall of the bore at least on the segment, typically at approximately 40 K-250 K, usually 40 K-100 K at least on the segment.

In a further preferred embodiment, the wall of the bore, in a central portion with respect to the longitudinal direction, is provided on its radially outer side with a coating which has a higher specific thermal conductivity than a basic structure of the wall of the bore, in particular wherein the coating is made of copper and the basic structure of the wall of the bore is made of stainless steel. This structure in turn makes it possible to keep the central portion (or the segment) evenly cold and to quickly dissipate any heat irradiation from radially inside, for example, from the probe, to the coupled heat sink. The radially outer side of the wall of the bore faces the vacuum in the vacuum container. The basic structure is usually a round pipe or a piece of pipe. The thermal conductivity is compared at operating temperature of the wall of the bore at least on the segment, typically at approximately 40 K-250 K, usually 40 K-100 K at least on the segment.

In a preferred development of this embodiment, the coating is formed at least in a region around a magnetic center of the magnetic coil system with interruptions extending in the longitudinal direction of the bore. The region around the magnetic center of the magnetic coil system extends in the longitudinal direction typically at least over an active region of the RF coil system (this is the region in which the RF coil system can excite the nuclear spins in the measurement sample with an RF pulse and from which the RF coil arrangement can receive signals from the measurement sample). As a result of the interruptions, electrical circulating currents in the (electrically highly conductive) coating, which could impair the NMR measurement, can be prevented. The region around the magnetic center extends along the z-direction (field direction, generally corresponds to the direction of the bore axis) typically over +/−10 cm to +/−30 cm on both sides of the center, preferably about +/−20 cm on both sides of the center.

In one preferred embodiment, the heat sink, to which at least the segment of the wall of the bore is thermally coupled,
- is a nitrogen container of the cryostat or a radiation shield of the cryostat connected to the nitrogen container, or
- a warmer cooling stage of a cryocooler or a radiation shield connected to a warmer cooling stage of a cryocooler, in particular wherein the cryocooler is designed as a pulse tube cooler, or
- a radiation shield which is cooled by evaporating helium from a cryogenic container, wherein the cryogenic container is arranged in the vacuum container and contains the magnetic coil system. These designs have proven themselves in practice. The aforementioned radiation shields are usually designed as sheet metal radiation shields. If the NMR measuring arrangement has a multi-stage cryocooler, the magnetic coil system is typically thermally coupled to a colder (in particular coldest) cooling stage of the cryocooler.

In an advantageous embodiment, at least the segment of the wall of the bore is thermally coupled to
- at least part of the NMR probe, and/or
- a gradient coil system which is arranged separately from the probe or as part of the probe in the bore, and/or
- a shim coil system which is arranged separately from the probe or as part of the probe in the bore. Due to the thermal coupling to at least the segment of the wall of the bore, cooling of the coupled component(s), such as the RF coil system and/or the gradient coil system and/or the electrical shim coil system, can be achieved with little effort during normal operation. As a result, separate local cooling systems on the NMR probe can possibly be avoided; the NMR probe is then preferably designed entirely without its own local cooling systems, which in turn saves installation space. By cooling the coupled component(s), the signal-to-noise ratio of the NMR measurements can be improved.

In one particularly preferred embodiment, the segment of the wall extends in the longitudinal direction of the bore at least over a length of an active region of the RF coil system. The measurement sample is arranged in the active region of the RF coil system, so that the associated installation space is particularly valuable for an accurate NMR measurement of the measurement sample.

In an additionally preferred embodiment, the segment of the wall extends in the longitudinal direction of the bore at least over a length of the magnetic coil system. In the case of a cylindrical bore and a cylindrical magnet bore, which often occurs in practice, the size (diameter) of the bore can be maximized with this design and the heat irradiation on the magnetic coil system can be kept particularly small.

Methods according to the invention and uses thereof

The use of an above-described NMR measuring arrangement according to a further formulation of the invention, as well as associated methods, also falls within the scope of the present invention and is characterized in that
an NMR measurement is carried out on a measurement sample arranged in the NMR probe, wherein, during the measurement, at least the segment of the wall of the bore is cooled to a temperature $T_{wall}$ <250K, in particular $T_{wall}$ <100K, and the bore is evacuated at least in the region of the segment or is filled with a dry gas or is flushed with a dry gas. In the context of this use, it is possible to obtain an accurate NMR measurement from the measurement sample (also simply called sample) and at the same time reduce the heat input into the magnetic coil system to a technically feasible and economically reasonable level. In particular, a large proportion of the magnet bore can be taken up by the measurement sample or used for measuring the measurement sample, and the superconducting magnetic coil system can move close to the measurement sample, which simplifies the establishment of a high magnetic field strength on the measurement sample.

In a preferred variant of the use according to the invention, at least part of the NMR probe is cooled during the measurement by thermal coupling to at least the segment of the wall of the bore. As a result, the signal-to-noise ratio of the measurement (NMR measurement) can be improved in a simple and cost-effective manner. The thermal coupling can preferably take place through mutual contact between the probe and the wall of the bore; alternatively or additionally, a dry gas contained in the bore can facilitate or strengthen a thermal coupling.

Another advantageous variant provides that at least part of the NMR probe is cooled with its own cooling device, wherein at least the segment of the wall of the bore limits an input of thermal radiation into the NMR probe. With the separate cooling device, it is also possible to cool and thereby improve the signal-to-noise ratio of the measurement (NMR measurement). As a result, a cryocooler of the cryostat is less or not at all impacted by the cooling of the NMR probe.

The present invention also comprises the use of an above-described NMR measuring arrangement according to the invention with a sealed space and a lock chamber, which is characterized in that the NMR probe is changed on the NMR measuring arrangement, wherein a first NMR probe is removed from the bore and discharged through the lock chamber, and a second NMR probe is introduced through the lock chamber and at least partially inserted into the bore, while a vacuum or a dry gas filling is maintained in the bore at least in the region of the segment of the wall of the bore. As part of the lock process, the sealed space is opened towards the lock chamber and closed again; the same condition (vacuum or dry gas) is set up in the lock chamber as in the sealed space. This approach particularly reliably prevents the formation of condensation on the (cold) segment but requires a certain amount of time for the lock processes. The desired atmospheric conditions on the cold segment are maintained throughout. NMR measuring arrangements with lock chambers can be used in particular for NMR probes, in which the measurement sample is "installed," and for inserting and removing the sample into and from the bore, the NMR probe and the measurement sample are inserted into and removed from the bore. In this case, when changing a sample, the second NMR probe can be the same probe as the first NMR probe but with a different measurement sample installed in the probe. Preferably, however, a plurality of NMR probes are kept available for the successive measurement of different measurement samples in order to be able to remove, parallel to main time, i.e., parallel to NMR measurements on a (first) NMR probe, a measured measurement sample from a further (second) NMR probe and install a measurement sample still to be measured; preferably, the first NMR probe and the second NMR probe are correspondingly formed by two separate probes (which also applies to the following uses). However, it must be noted that, in other designs of NMR measuring arrangements, a change of a measurement sample is possible with the NMR probe remaining in the bore, which is generally preferred.

The present invention also comprises a use of an above-described NMR measuring arrangement according to the invention with a dry gas flushing device, which is characterized in that the NMR probe is changed on the NMR measuring arrangement, wherein a first NMR probe is removed from the bore and a second NMR probe is at least partially inserted into the bore, while the bore is flushed at least in the region of the segment with a dry gas, in particular dry nitrogen or dry helium, using the dry gas flushing device. This approach is quick, easy, and cost-effective and minimizes the formation of condensation on the (cold) segment.

The present invention also comprises a use of an NMR measuring arrangement according to the invention with a heating device, which is characterized in that the NMR probe on the NMR measuring arrangement is changed, wherein a first NMR probe is removed from the bore and a second NMR probe is at least partially inserted into the bore, while the bore is heated with the heating device at least in the region of the segment, so that a formation of condensation is avoided on the wall of the bore, in particular wherein the wall of the bore at least in the region of the segment on its the side facing the environment has a temperature of at least 10° C. This approach is comparatively simple and minimizes a formation of condensation on the segment (which is cold during normal operation) but requires specific waiting times for reaching the respective required temperatures on the segment.

Further advantages of the invention can be found in the description and the drawings. The features according to the invention that are mentioned above and further described in the following can each also be used in isolation or together in any combinations. The embodiments shown and described are not to be understood as an exhaustive list but instead are of an exemplary nature for describing the invention.

BRIEF DESCRIPTION OF THE DRAWINGS

FIG. 5 shows a schematic longitudinal section of a fourth embodiment of an NMR measuring arrangement according to the invention, with an NMR probe inserted into a bore closed on one side, with a lock chamber and a pump device;

FIG. 6 shows a schematic longitudinal section of a fifth embodiment of an NMR measuring arrangement according to the invention, with a two-stage cryocooler and a magnetic coil system arranged in a cryogenic container;

FIG. 7 shows a schematic longitudinal section of a sixth embodiment of an NMR measuring arrangement according to the invention, with a two-stage cryocooler and a magnetic coil system arranged directly in the vacuum container;

FIG. 8A is a schematic oblique view of a central tube of a vacuum container for the invention, with a slitting of a radially outer coating in a central portion;

FIG. 8B is a schematic side view of the central tube of FIG. 8A;

FIG. 8C shows a cross section of the central tube at sectional plane A-A of FIG. 8A;

FIG. 8D shows an enlarged detail from the cross section of FIG. 8B in the region of marking circle D.

DETAILED DESCRIPTION

The figures show NMR measuring arrangements according to the prior art and according to the invention by way of example. The depictions are roughly schematic, and in particular some structures are shown enlarged or reduced in comparison to other structures in order to make the invention easier to understand.

Figure 1:
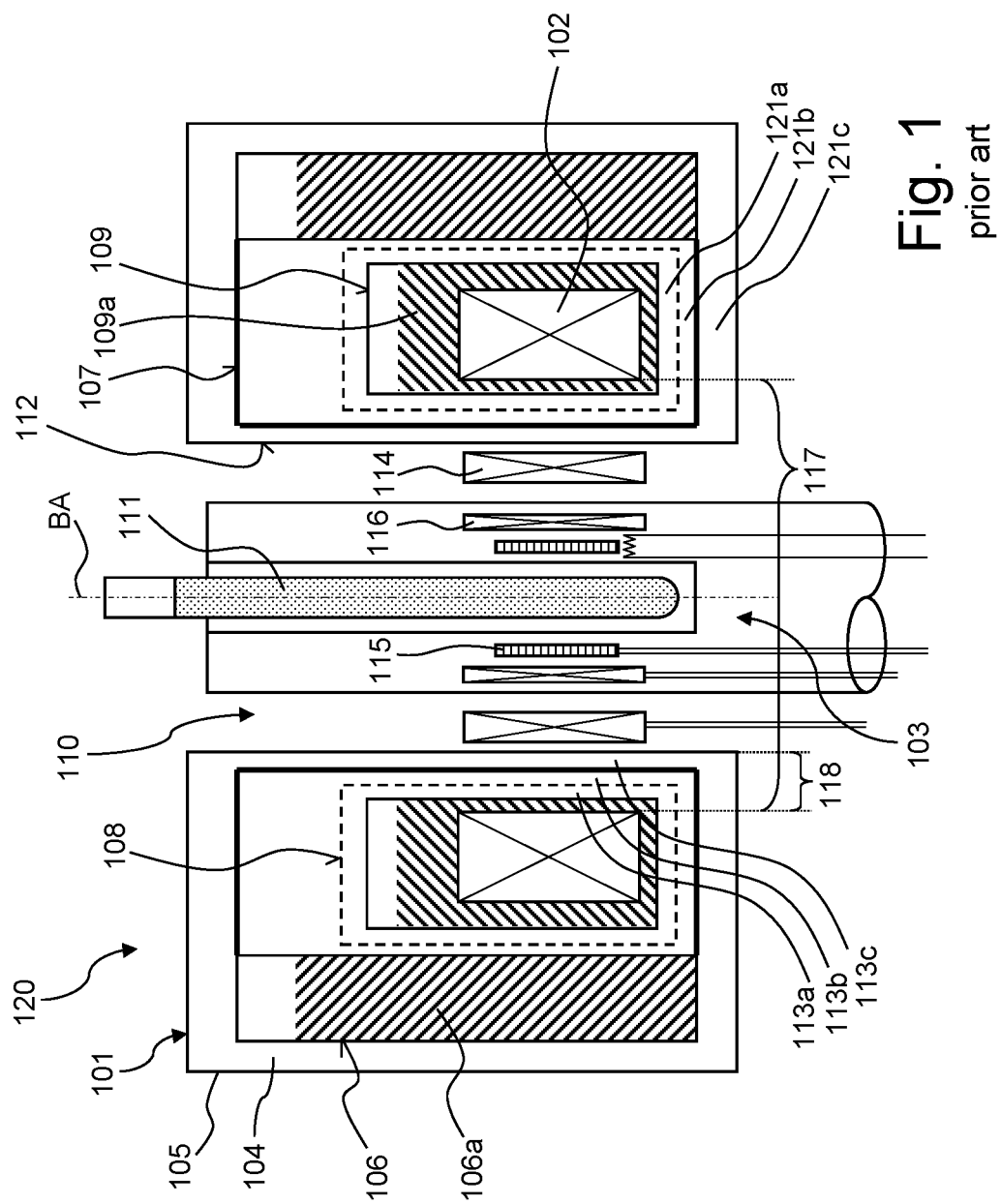
FIG. 1 shows a schematic longitudinal section of an exemplary NMR measuring arrangement according to the prior art.

FIG. 1 shows an example of an NMR measuring arrangement 120 according to the prior art.

The NMR measuring arrangement 120 has a cryostat 101, a superconducting magnetic coil system 102, and an NMR probe 103.

In this case, the cryostat 101 has a central through-bore 110 along a bore axis BA. The NMR probe 103 is arranged in the bore 110. The bore 110 also lies radially inside and coaxially to a magnet bore 117 of the magnetic coil system 102. A measurement sample 111, on which an NMR measurement can be performed, is inserted into the NMR probe 103. Furthermore, an electrical shim coil system 114 is arranged in the bore 110. The NMR probe 103 herein has an RF coil system 115 and a gradient coil system 116.

In the design shown, the cryostat 101 has a vacuum container 105, in the evacuated interior 104 of which a nitrogen container 106 with liquid nitrogen (LN2) 106a is arranged, which cools an outer sheet metal radiation shield 107 as a heat sink. The outer sheet metal radiation shield 107, together with the nitrogen container 106, surrounds an inner sheet metal radiation shield 108 which herein is designed as a "passive" radiation shield and is not separately coupled to a heat sink. The inner sheet metal radiation shield 108 in turn surrounds a cryogenic container 109 which contains liquid helium (LHe) 109a as cryogenic fluid which, as a further heat sink, cools the magnetic coil system 102 also arranged in the cryogenic container 109.

The bore 110 is designed as a room temperature bore, i.e., the wall 112 of the bore 110, which also delimits the vacuum container 105 or its evacuated interior 104, is approximately at room temperature. This is achieved by good thermal insulation between the wall 112 of the bore 110 and the cryogenic container 109, which thermal insulation is based herein on a total of three evacuated gaps 113a-113c in the space 118 between the magnetic coil system 102 and the wall 112 of the bore 110. In the (radial) sequence from the inside out (as seen from the magnetic coil system 102 towards the wall 112 of the bore 110, i.e., radially inwardly), a first evacuated gap 113a is formed between the cryogenic container 109 and the inner sheet metal radiation shield 108. A second evacuated gap 113b is formed between the inner sheet metal radiation shield 108 and the outer sheet metal radiation shield 107. A third evacuated gap 113c is formed between the outer sheet metal radiation shield 107 and the wall 112 of the bore 110 (wherein the wall 112 is part of the vacuum container 105).

Due to the three evacuated gaps 113a-113c, a considerable proportion of the magnet bore 117 of the magnetic coil system 102 is used up and is therefore not available for the actual NMR measurement on the measurement sample 111, and the magnetic coil system 102 must maintain a relatively large radial distance from the bore 110. This complicates the generation of high magnetic field strengths and makes high-quality NMR measurements on the measurement sample 111 more difficult.

It must be noted that in the design of FIG. 1, proceeding from the magnetic coil system 102 in the sequence from the inside out towards the vacuum container 105, three evacuated gaps are present not only towards the wall 112 but also towards other wall segments, for example, the three evacuated gaps 121a, 121b, 121c downwards in the axial direction.

Figure 2:
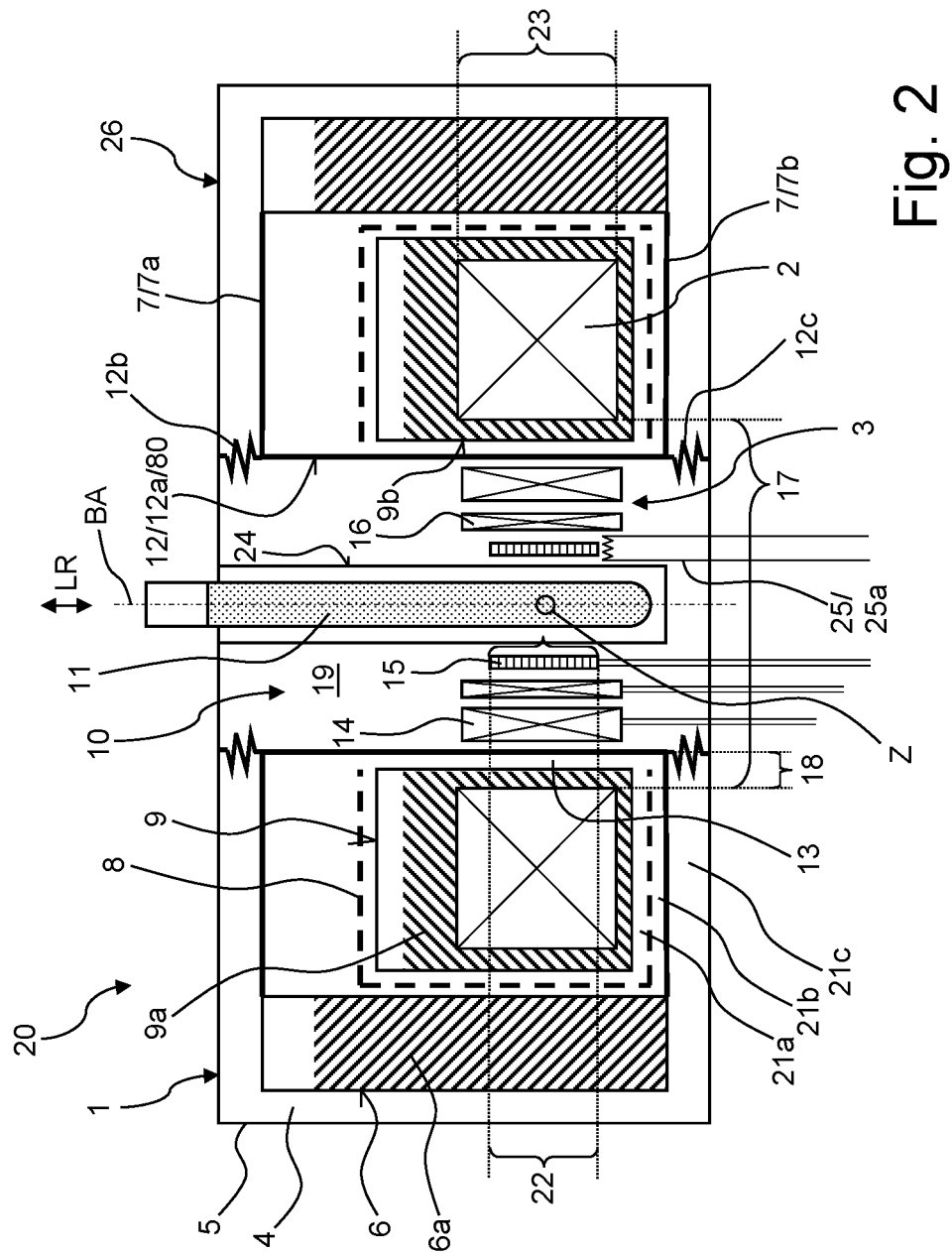
FIG. 2 shows a schematic longitudinal section of a first embodiment of an NMR measuring arrangement according to the invention, with an NMR probe fixedly installed in a bore.

FIG. 2 shows a first embodiment of an NMR measuring arrangement 20 according to the invention in a schematic longitudinal section. The differences from the design of FIG. 1 will primarily be described.

The NMR measuring arrangement 20 has a cryostat 1, a superconducting magnetic coil system 2, which is arranged in the cryostat 1, and an NMR probe 3 which is arranged in a central bore 10 of the cryostat 1 running along a herein vertical bore axis BA. The bore axis BA defines a longitudinal direction LR.

The bore 10 lies radially inside and coaxially to a magnet bore 17 of the magnetic coil system 2. In this case, the bore 10 is closed on both sides with a sample recess 24 accessible from the outside. The magnetic coil system 2, designed in this case as a solenoid and essentially in the form of a cylinder jacket, generates a homogeneous static magnetic field in a region around a magnetic center Z, which is directed parallel to the bore axis BA, for an NMR measurement on a measurement sample 11 in the sample recess 24.

The cryostat 1 has a vacuum container 5, the interior 4 of which is evacuated; the wall 12 of the bore 10 also delimits, namely radially inwardly, the vacuum container 5. In this case, the wall 12 is designed in the shape of a cylinder jacket. The wall 12 of the bore is also referred to as the central tube 80.

In the embodiment shown, a nitrogen tank 6 is arranged in the vacuum container 5, which is filled with liquid nitrogen (LN2) 6a (at approximately 77 K) and serves as a heat sink. An outer sheet metal radiation shield 7, which is formed with an upper shield part 7a and a lower shield part 7b, is connected, and thus thermally coupled, to the nitrogen tank 6. These two shield parts 7a, 7b are in turn coupled to the wall 12 of the bore 10, wherein the wall 12 delimits the vacuum container 5 radially inwardly. As a result, a central portion 12a of the wall 12 is also thermally coupled to the nitrogen tank 6. The central portion 12a of the wall 12 is thus cooled.

In the embodiment shown, a cryogenic container 9 is also arranged in the vacuum container 5, in which liquid helium (LHe) 6a (at approximately 4.2 K or even colder) is arranged as the cryogenic fluid and which serves as a further heat sink. The superconducting magnetic coil system 2 is also arranged within this cryogenic container 9 and thus cooled. With the exception of the radially inner side, the cryogenic container 9 is surrounded on all sides by an inner sheet metal radiation shield 8. The inner sheet metal radiation shield 8 is in turn surrounded radially outwardly by the nitrogen tank 6 and axially upwardly and axially downwardly by the outer sheet metal radiation shield 7 or the shield parts 7a, 7b.

However, the wall 12 of the bore 10 lies directly opposite the radially inner wall 9b of the cryogenic container 9, separated only by a single evacuated gap 13. Therefore, in the space 18 between the magnetic coil system 2 and the wall 12 of the bore 10, there is overall only a single evacuated gap 13 in the (radial) sequence from the inside out (from the magnetic coil system 2 towards the wall 12 of the bore 10, i.e., radially inwardly). In particular, no sheet metal radiation shields are arranged in this space 18; the two sheet metal radiation shields 7 and 8 are interrupted in the region of this space 18.

The single gap 13, only uses a small proportion of the magnet bore 17 of the magnetic coil system 2 and the magnetic coil system 2 can move relatively close to the bore 10 or the wall 12. As a result, a relatively large space is available in the magnet bore 17 for the actual NMR measurement on the measurement sample 11 and in particular for the measurement sample 11 itself, and high quality NMR measurements can be carried out on the measurement sample 11 in the bore 10.

It must be noted that in the embodiment of FIG. 2, proceeding from the magnetic coil system 2, three evacuated gaps each are present in the sequence from the inside out to the vacuum container 5 towards wall segments of the vacuum container 5 other than the wall 12, for example, the three evacuated gaps 21a, 21b, 21c downwards in the axial direction. The thermal insulation of the cryogenic container 9 or the magnetic coil system 2 is therefore not unnecessarily weakened axially upwardly or downwardly or also radially outwardly, where the installation space is not limited.

Due to the cooling of the wall 12 or its central portion 12a via the nitrogen tank 6 as a heat sink, a heat input into the cryogenic container 9 and thus into the magnetic coil system 2 can be limited to an acceptable level, even though only one evacuated gap 13 is available radially inwardly (in front of the wall 9b) for thermal insulation on the side of the cryogenic container 9. In particular, it remains possible to maintain the cryogenic container 9 at a desired temperature (usually 4.2 K or less) with acceptable operating costs.

The wall 12 of the bore 10 has a multipiece design and herein comprises the central portion 12a and two axially outer portions 12b, 12c. The coupling of the outer sheet metal radiation shield 7 takes place near the axially outer ends of the central portion 12a. In this case, the outer portions 12b, 12c thus form the transition from the central portion 12a (delimited by the coupling points of the outer sheet metal radiation shield 7) to the rest of the vacuum container 5 (which can also be referred to as the room temperature jacket 26). The outer portions 12b, 12c are used to thermally decouple the central portion 12a from the rest of the vacuum container 5 or its remaining outer wall (located at a distance from the bore 10), i.e., from the room temperature jacket 26. Herein, the outer portions 12b, 12c are designed as bellows and have a reduced thermal conductivity and/or a reduced wall thickness when compared to the central portion 12a of the wall 12 (and preferably also when compared to the rest of the outer wall of the vacuum container 5 or the room temperature jacket 26). For example, the central portion 12a can be designed as a steel pipe with a copper coating (not shown in detail in FIG. 2, but cf. FIGS. 8A-8D hereto), and the outer portions 12b, 12c are made of steel and designed with a thinner wall thickness without a copper coating.

In the embodiment shown, the bore 10 is designed to be gas-tight at the top and bottom, as a result of which a hermetically sealed space 19 is formed in the bore 10. The sealed space 19 lies in particular outside of the vacuum container 5 or of its evacuated interior 4. The wall 12 of the bore 10 also delimits the sealed space 19. The NMR probe 3, herein comprising an RF coil system 15, a gradient coil system 16, and an electrical shim coil system 14, is permanently arranged in the bore 10 in this sealed (closed) space 19. The sealed space 19 is delimited radially inwardly by the sample recess 24. In the sample recess 24, the measurement sample 11 (herein a tube filled with a sample liquid) is arranged under ambient pressure.

The sealed space 19 is filled with a dry gas, for example, dry nitrogen. The filling with dry gas can take place via a dry gas filling device not shown in detail in FIG. 2 (corresponding to the dry gas filling device 41a in FIG. 4). The dry gas thermally couples, and thus cools, the NMR probe 3 or its components arranged in the sealed space 19 (herein the RF coil system 15, the gradient coil system 16, and the shim coil system 14) to the wall 12, thereby improving the signal-to-noise ratio of the NMR measurements on the measurement sample 11. Devices for reducing convection in the dry gas can be provided in the sealed space 19, in particular so-called "baffles" (not shown in detail); as a result, in particular an axial convective heat flow can be kept small.

Alternatively or additionally, components of the NMR probe 3, in particular the shim coil system 14, can also be coupled to the wall 12 via a solid-state connection with good thermal conductivity, for example, made of copper (not shown in detail).

Alternatively, the sealed space 19 can be evacuated during normal operation with a pump device not shown in detail (corresponding to the pump device 50 of FIG. 5), which improves thermal insulation of the components of the NMR probe 3.

Furthermore, in the embodiment shown, a separate cooling device 25 is provided for the RF coil system 15 in the NMR probe 3. The separate cooling device 25 comprises a cooling line 25a, with which a cold fluid (usually helium) is fed to the RF coil system 15 (typically under a pressure of several bar), whereby (in addition to the coupling via the dry gas to the wall 12, or if the sealed space 19 is evacuated by its own cooling device 25 alone) it is cooled to a desired measurement temperature. The fluid cycles in the cooling line 25a, i.e., fluid heated on the RF coil system 15 flows back from the NMR probe 3 and is cooled again outside of the NMR probe 3 in a manner not shown in detail and then fed back to the NMR probe 3. In the event of a leak in the cooling line 25, the fluid escapes only into the bore 10 or the sealed space 19 but not into the evacuated interior 4 of the vacuum container 5; therefore, there is no risk of quenching the magnetic coil system 2 due to such a leak.

In the variant shown, the wall 12 is thermally coupled over almost the entire axial length of the wall 12 of the bore 10 to the heat sink which is formed by the nitrogen tank 6. It must be noted that in other embodiments, it is possible that only one segment of the wall 12 with an axial length corresponding to the active region 22 of the RF coil system 15 or corresponding to the axial length 23 of the magnetic coil system 2 is coupled to the heat sink (not shown in detail).

It must be noted that, for maintaining the cooling of the magnetic coil system 2, the liquid nitrogen 6a and the liquid helium 9a can be refilled if necessary and/or the nitrogen container 6 and/or the cryogenic container 9 can be actively cooled by one or more cryocoolers (not shown in detail). The nitrogen tank 6 and the cryogenic container 9 have lines which allow vaporized cryogens (helium, nitrogen) to escape (not shown in detail).

Figure 3:
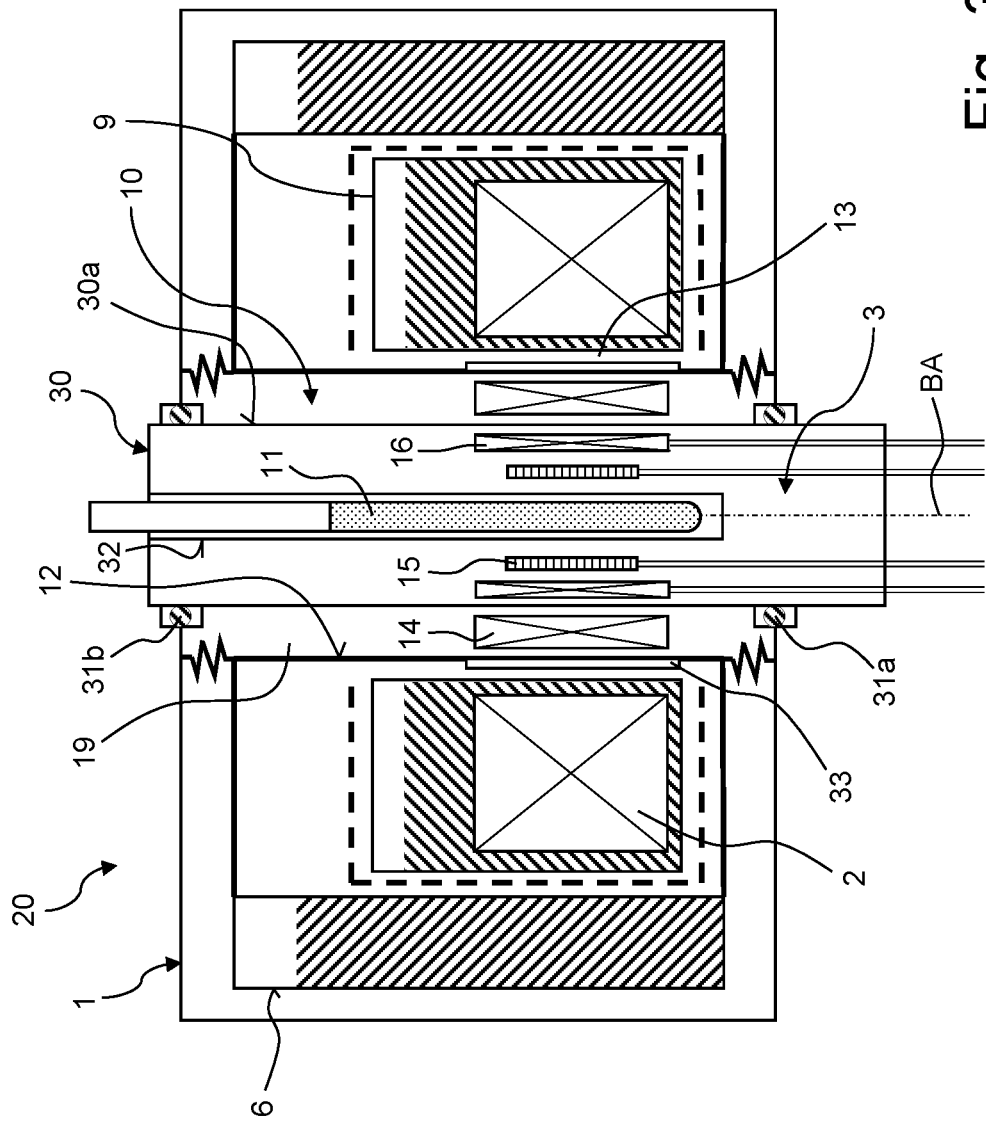
FIG. 3 shows a schematic longitudinal section of a second embodiment of an NMR measuring arrangement according to the invention, with an NMR probe inserted into a through-bore, with two radial seals and a heating device.

FIG. 3 shows a second embodiment of a measuring arrangement 20 according to the invention, which is similar in part to the embodiment of FIG. 2, so that only the essential differences will be described below.

In the embodiment of FIG. 3, the cryostat 1 is designed with a through-bore 10. The NMR probe 3 is designed with a housing 30 having a radially outer, gas-tight housing wall 30a, wherein the RF coil system 15 and in this case also the gradient coil system 16 are arranged within the housing 30. The housing 30 is preferably designed to be gas-tight overall, so that it is evacuable, for example, for thermal insulation. The sealed space 19 is delimited by the wall 12 of the bore 10, the gas-tight housing wall 30a, and two radial seals 31a, 31b, herein continuous rubber rings; the bore 10 is closed at its two axial ends (openings), respectively, by the NMR probe 3 during normal operation. The NMR probe 3 or its housing 30 forms a sample recess 32 for the measurement sample 11 which is arranged in the sample recess 32 under ambient pressure. The fact that the front (herein upper) end of the NMR probe 3 protrudes through the bore 10 (i.e., it protrudes from the bore 10 at the front or top), the sample recess 32, for a change of the measurement sample 11 (herein from above), is directly accessible from the surroundings, in particular without having to remove (uninstall) the NMR probe 3 from the bore 10. Accordingly, a sample change is possible in a very simple and quick manner.

In order to change the NMR probe 3, for example, in the event of a defect or for maintenance, the NMR probe 3 can be pulled out of the bore 10 in the axial direction (herein downwards) along the bore axis BA and replaced by another NMR probe 3 which is inserted into the bore 10 in the axial direction (herein upwards).

As a result, the bore 10 is temporarily opened at both ends and exposed to the atmospheric conditions of the environment. In order to prevent the formation of condensation and icing of the wall 12 of the bore 10 cooled by the nitrogen tank 6 during this time, an electrical heating device 33 is activated which in this case is formed on the radially outer side of the wall 12. With the heating device 33, the wall 12 is heated to at least 10° C.; the resulting heat load on the nitrogen tank 6 and also on the cryogenic container 9 is acceptable for the short duration of a probe change without having to fear a quench in the superconducting magnetic coil system 2 or noticeable additional operating costs.

The volume of the sealed space 19 is relatively small, so that humidity contained in this volume does not cause any noticeable formation of condensation during normal operation (with deactivated heating device); by sealing with the radial seals 31a, 31b, an air exchange with the surroundings and thus the input of further moisture is prevented. In addition, it can be provided that the sealed gas space 19 is evacuated for normal operation or filled with a dry gas (hereto cf. FIG. 4 or 5) in order to exclude even the smallest amounts of condensation.

Figure 4:
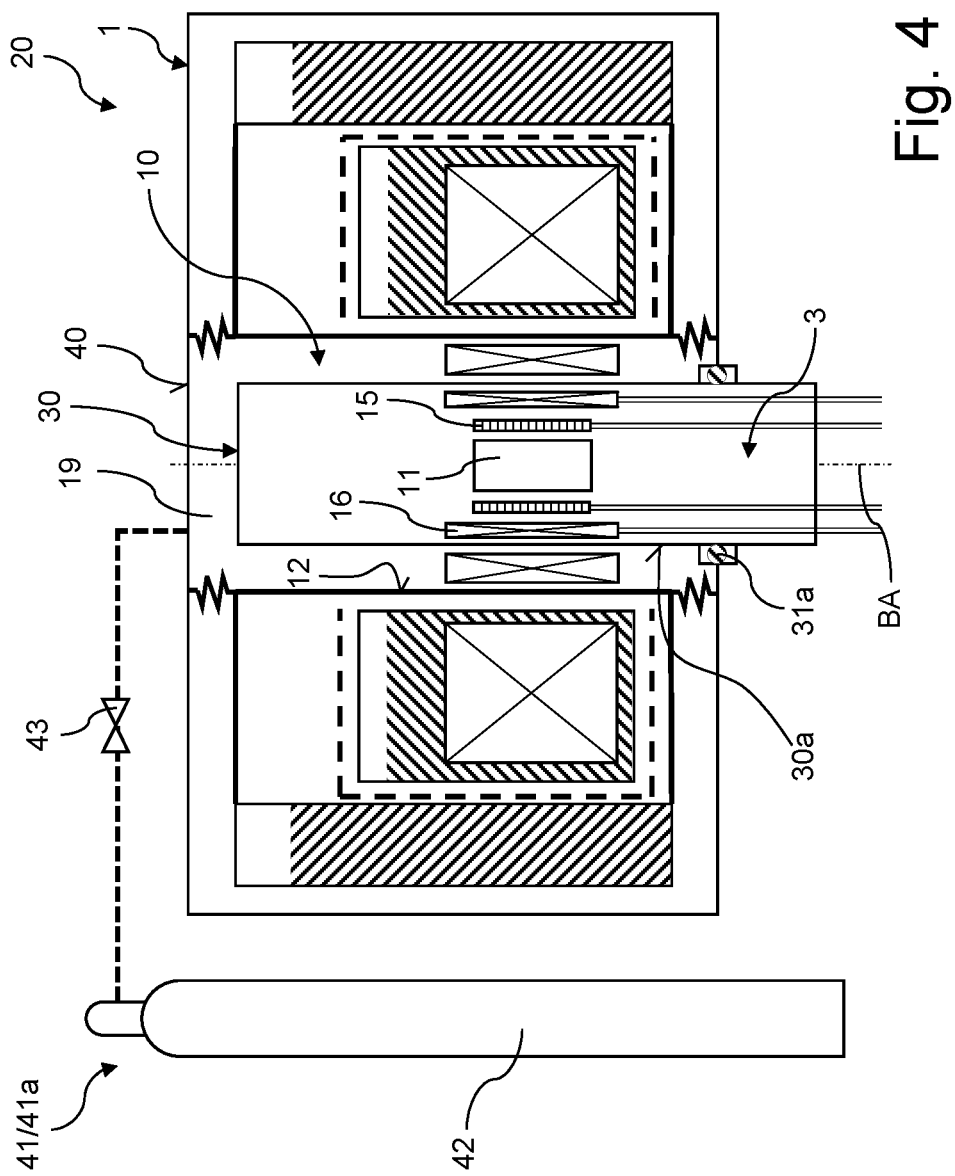
FIG. 4 shows a schematic longitudinal section of a third embodiment of an NMR measuring arrangement according to the invention, with an NMR probe inserted into a bore closed on one side, with a radial seal and a dry gas flushing device.

Instead of or in addition to activating the heating device 33, it is possible to flush the bore 10 with dry gas during the probe change (hereto cf. FIG. 4).

It is also possible—but not shown in detail—to design the NMR probe to be divided, and to insert one part (e.g., an electrically active part with RF coil system, shim coil system, and gradient coil system) from one side (usually the bottom), and insert another part (e.g., a part that contains the devices for sample supply and rotation) into the bore from another side (usually from the top).

FIG. 4 shows a third embodiment of a measuring arrangement 20 according to the invention, which is similar in part to the embodiment of FIG. 2, so that only the essential differences will be described below.

In the embodiment of FIG. 4, the cryostat 1 is designed with a bore 10 that is open on one side (bottom); on the upper side, the bore 10 is closed with a cover 40. The NMR probe 3 is designed with a housing 30 with gas-tight housing walls 30a, within which the RF coil system 15 and in this case also the gradient coil system 16 are arranged. The sealed space 19 is delimited by the wall 12 of the bore 10, the gas-tight housing wall 30a, and a radial seal 31a in the region of the lower opening of the bore 10; the NMR probe 3 thus closes the lower opening of the bore 10 during normal operation. The NMR probe 3 also contains the installed measurement sample 11.

In order to change the NMR probe 3, in particular for changing the measurement sample 11, the NMR probe 3 can be pulled out in the axial direction along the bore axis BA downwards from the bore 10 and replaced by another NMR probe 3 containing another measurement sample 11, which is inserted into the bore 10 in the axial direction from the bottom. As a result, the bore 10 is temporarily opened at its lower end and exposed to the atmospheric conditions of the environment. In order to prevent a formation of condensation and icing of the wall 12 of the bore 10, which is cooled by the nitrogen tank 6, during this time, a dry gas flushing device 41 is activated, which herein flushes the bore 10 from the cover 40 with a dry gas, for example, dry nitrogen. In the process, dry gas is constantly forced downwards and out of the bore 10, so that no noticeable inflow of (moist) ambient air into the bore 10 can occur.

In this case, the dry gas flushing device 41 comprises a pressurized gas cylinder 42 with dry gas and a control valve 43 in a gas line leading from the pressurized gas cylinder 42 to the cover 40.

The depicted dry gas flushing device 41 can also be used as a dry gas filling device 41a in order to fill the sealed space 19 with dry gas after a probe change. For this purpose, the sealed space 19 can first be evacuated with a pump device (not shown, but cf. FIG. 5 hereto), or air initially contained in the sealed space 19 is pushed out of the sealed space 19 by inflowing dry gas via an outlet valve or relief valve (not shown in detail).

FIG. 5 shows a third embodiment of a measuring arrangement according to the invention, which is similar in part to the embodiment of FIG. 4, so that only the essential differences will be described below.

The NMR measuring arrangement 20 of this embodiment also has a cryostat 1 with a bore 10 which is open on one side (downwards) into which the NMR probe 3 can be inserted axially upwardly, as described in FIG. 4, and from which the NMR probe 3 can be pulled out axially downwardly, wherein, in the inserted state, the sealed space shown (reference sign 19) in FIG. 4 is delimited by the wall 12 of the bore 10, the gas-tight housing wall 30a, and the radial seal 31a.

In the embodiment of FIG. 5, a lock chamber 54 is arranged at the lower end (at the lower opening) of the bore 10. The interior of the bore 10 and the interior of the lock chamber 54 can be separated from one another in a vacuum-tight manner with a gate valve 55. A pump device 50 can evacuate the bore 10 and the lock chamber 54 independently of one another via control valves 51 and 52 and associated pump lines. In this embodiment, the bore 10 is always kept under vacuum in order to prevent condensation from forming on the cold wall 12 of the bore 10.

FIG. 5 shows the NMR measuring arrangement 20 in a state with the NMR probe 3 withdrawn into the lock chamber 54. If the bore 10 and the lock chamber 54 have been evacuated with the pump device 50, the NMR probe 3 can be moved between the bore 10 and the lock chamber 54 when the gate valve 55 is open.

For a manipulation of the NMR probe 3, for example, for a change of the measurement sample 11 installed in the probe 3, or for a complete change of the NMR probe 3, the probe 3 can be withdrawn into the lock chamber 54, and the bore 10 can be closed with the gate valve 55. The lock chamber 54 can then be opened via a door (not shown in detail) in order to carry out desired manipulations on the NMR probe 3, for example, to change the measurement sample 11; if necessary, the NMR probe 3 can also be removed from the lock chamber 54 for the manipulation. Alternatively, the lock chamber 54 can also be removed from the cryostat 1 (in this case, the gate valve 55 remains on the cryostat 1); the NMR probe 3 can then be removed from the lock chamber 54 through the opening at the front (at the connection for the gate valve 55).

When the manipulations are completed and with the NMR probe 3 arranged in the lock chamber 54, the door (not shown in detail) of the lock chamber 54 is closed again or the lock chamber 54 is mounted again on the cryostat 1 and the lock chamber 54 is evacuated (with the control valve 52 open). The gate valve 55 can then be opened and the NMR probe 3 can be inserted from the lock chamber 54 into the bore 10.

In the embodiment shown, the NMR probe 3 is so long that the gate valve 55 cannot be closed in the state of normal operation where the probe is inserted into the bore 10. However, due to the sealing of the sealed space (reference sign 19 in FIG. 4) with the radial seal 31a, it is not necessary to keep the lock chamber 54 at a vacuum during normal operation.

In a variant (not shown) of the embodiment of FIG. 5, the bore 10 is designed as a through-bore, with two radial seals at the upper and lower opening of the bore, and with a sample recess in the probe accessible from the top (cf. FIG. 3 hereto). The lock chamber is formed in front of the lower opening of the bore, and a further lock chamber is formed in front of the upper opening. The sample recess for a sample change is accessible via the further lock chamber without having to break the vacuum in the sealed space between the wall of the bore, the two radial seals, and the housing wall of the NMR probe.

FIG. 6 shows a fifth embodiment of an NMR measuring arrangement 20 according to the invention, which is similar in part to the embodiment of FIG. 3, so that only the essential differences will be described below.

In this embodiment, no nitrogen tank 6 is provided as a heat sink for the wall 12 of the bore 10 in the cryostat 1, but a warmer (herein warmest) cooling stage 61 of a cryocooler 60, herein a pulse tube cooler, is provided. This warmer cooling stage 61 is thermally coupled to the outer sheet metal radiation shield 7, herein by direct contact with the upper shield part 7a. In addition to the upper shield part 7a and the lower shield part 7b, the outer sheet metal radiation shield 7 also has a radially outer shield part 7c. The outer sheet metal radiation shield 7 surrounds the inner sheet metal radiation shield 8 on all sides, except on the radially inner side, and thus also the cryogenic container 9 and the magnetic coil system 2 contained therein. The upper shield part 7a and the lower shield part 7b are in turn connected, and thus thermally coupled, to the wall 12, so that the wall 12 is coupled with its central portion 12a to the warmer cooling stage 61 of the cryocooler 60.

The cryocooler 60 also has a colder (herein coldest) cooling stage 62, which is thermally coupled, herein by direct contact, to the cryogenic container 9 (and the magnetic coil system 2 contained therein) as a further heat sink.

As described above, the NMR measuring arrangement 20 can additionally be provided, for example, with a heating device or a dry gas flushing device (not shown in detail in FIG. 6) in order to avoid condensation forming on the wall 12 of the bore 10 when the probe is changed.

FIG. 7 shows a sixth embodiment of an NMR measuring arrangement 20 according to the invention, which is similar in part to the embodiment of FIG. 6, so that only the essential differences will be described below.

In this embodiment, the superconducting magnetic coil system 2 is not arranged in a cryogenic container with liquid helium but directly in the evacuated interior 4 of the vacuum container 5 and is thus exposed to the insulation vacuum. The magnetic coil system 2 is thermally coupled to the colder cooling stage 62 of the cryocooler 60, herein by direct contact of the colder cooling stage 62 with the magnetic coil system 2.

In this case, the space 18 radially between the magnetic coil system 2 and the wall 12 of the bore 10 is completely occupied by the (single) evacuated gap 13. In this embodiment, the magnetic coil system 2 can move particularly close to the bore 10, and a particularly large proportion of the magnet bore 17 can be used for the actual NMR measurement and in particular for the measurement sample 11 itself.

FIGS. 8A-8D schematically describe the structure of an exemplary embodiment of a central tube 80 of a vacuum container of a cryostat for an NMR measuring arrangement according to the invention. The central tube 80 essentially forms the central portion 12a of the wall 12 of the bore 10, which lies radially inside the central tube 80. FIG. 8A is an oblique view, FIG. 8B is a side view, FIG. 8c shows a section in the plane A-A of FIG. 8B, and FIG. 8D shows a detail corresponding to marking circle D in FIG. 8C.

In this case, the central tube 80 consists essentially of a steel pipe lying radially inside as a basic structure 83, on which a coating 84 made of copper is applied, lying radially outside. The copper of the coating 84 has a higher specific thermal conductivity than the steel (preferably stainless steel) of the steel pipe of the basic structure 83.

In a region 82 around the magnetic center of the magnetic coil system (see reference sign Z in FIG. 2), the coating 84 is provided with interruptions (slits) 81 running in the longitudinal direction LR (along the bore axis BA). In the embodiment shown, the coating 84 forms axial fingers 85 alternately protruding from both axial sides in the circumferential direction and axial recesses 86 which interlock.

The axial interruptions 81 prevent electrical circulating currents running in the circumferential direction in the region 82.

LIST OF REFERENCE SIGNS

1 Cryostat
2 Superconducting magnetic coil system
3 NMR probe
4 Interior
5 Vacuum container
6 Nitrogen tank
6a Liquid nitrogen
7 Outer sheet metal radiation shield
7a Upper shield part
7b Lower shield part
7c Radially outer shield part
8 Inner sheet metal radiation shield
9 Cryogenic container
9a Liquid helium
9b Radially inner wall of the cryogenic container
10 Bore (of the cryostat)
11 Measurement sample
12 Wall of the bore
12a Central portion of the wall of the bore
12b Outer portion of the wall of the bore
12c Outer portion of the wall of the bore
13 Evacuated gap (in the space between magnetic coil system/wall of the bore)
14 Shim coil system
15 RF coil system
16 Gradient coil system
17 Magnet bore
18 Space (magnetic coil system/wall of the bore)
19 Sealed space
20 NMR measuring arrangement
21a Evacuated gap
21b Evacuated gap
21c Evacuated gap
22 Active region of the RF coil system
23 Axial length of the magnetic coil system
24 Sample recess (of the bore)
25 Separate cooling device
25a Cooling line
26 Room temperature jacket/remaining part of the vacuum container
30 Housing (of the probe)
30a Gas-tight housing wall
31a (Lower) radial seal
31b (Upper) radial seal
32 Sample recess (of the NMR probe)
33 Heating device
40 Cover
41 Dry gas flushing device
41a Dry gas filling device
42 Pressurized gas cylinder
43 Control valve
50 Pump device
51 Control valve
52 Control valve
54 Lock chamber
55 Gate valve
60 Cryocooler
61 Warmer cooling level
62 Colder cooling level
80 Central tube
81 Interruption
82 Region around the magnetic center
83 Basic structure
84 Coating
85 Finger
86 Recess
100 Cryostat
102 Superconducting magnetic coil system
103 NMR probe
104 Interior
105 Vacuum container
106 Nitrogen tank
106a Liquid nitrogen
107 Outer sheet metal radiation shield
108 Inner sheet metal radiation shield
109 Cryogenic container
109a Liquid helium
110 Bore (of the cryostat)
111 Measurement sample
112 Wall of the bore
113a Evacuated gap (in the space between magnetic coil system/wall of the bore)
113b Evacuated gap (in the space between magnetic coil system/wall of the bore)
113c Evacuated gap (in the space between magnetic coil system/wall of the bore)
114 Shim coil system
115 RF coil system
116 Gradient coil system
117 Magnet bore
118 Space (magnetic coil system/wall of the bore)
120 NMR measuring arrangement
121a Evacuated gap
121b Evacuated gap
121c Evacuated gap
BA Bore axis
LR Longitudinal direction
Z Magnetic center

What is claimed is:

1. Nuclear magnetic resonance (NMR) measuring arrangement, comprising
    a cryostat having an evacuated vacuum container, wherein the cryostat forms a bore having a bore wall that delimits the vacuum container,
    a superconducting magnet coil system having a magnet bore, wherein the magnet coil system is arranged directly inside or indirectly inside the vacuum container, wherein the cryostat, for thermally insulating the magnet coil system, forms one or more evacuated gaps between the superconducting magnetic coil system and the vacuum container in a sequence from the inside out, and wherein the bore extends through the magnet bore, and
    an NMR probe having a radio frequency (RF) coil system, wherein the NMR probe is arranged outside the vacuum container, and wherein the NMR probe is arranged at least partially in the bore,
    wherein the cryostat forms only one evacuated gap in a space extending between the magnet coil system and the bore wall,
    wherein at least a length of a segment of the bore wall is thermally coupled to a heat sink of the cryostat, and
    wherein the bore wall also delimits a hermetically sealed space outside the vacuum container,
    wherein the sealed space extends in the bore in a longitudinal direction of the cryostat at least over the length of the segment.

2. NMR measuring arrangement according to claim 1, wherein the bore wall and a housing wall of the NMR probe are sealed against one another with one or more seals.

3. NMR measuring arrangement according to claim 1, further comprising a lock chamber formed at an opening of the bore and configured to introduce and to discharge the NMR probe for an at least partial arrangement in the bore.

4. NMR measuring arrangement according to claim 1, further comprising a pump device configured to evacuate the sealed space.

5. NMR measuring arrangement according to claim 1, further comprising a dry gas filling device configured to fill the sealed space with a dry gas.

6. NMR measuring arrangement according to claim 1, wherein the cryostat comprises a dry gas flushing device configured to flush the bore with a dry gas at least in the region of the segment.

7. NMR measuring arrangement according to claim 1, further comprising a heating device.

8. NMR measuring arrangement according to claim 1, wherein at least the segment of the bore wall is substantially thermally decoupled from a remainder of the vacuum container which remainder corresponds to a room temperature jacket of the vacuum container, whereby a remaining thermal coupling is less than 0.1 W/K.

9. NMR measuring arrangement according to claim 8, wherein the bore wall consists of, with respect to the longitudinal direction, a central portion and two outer portions, and wherein the central portion is made from a material with a higher specific thermal conductivity and/or with a greater wall thickness than materials of the two outer portions.

10. NMR measuring arrangement according to claim 1, wherein the bore wall, in a central portion with respect to the longitudinal direction, is provided on a radially outer side of the bore wall with a coating which has a higher specific thermal conductivity than does a basic structure of the bore wall without the coating.

11. NMR measuring arrangement according to claim 10, wherein the coating is formed at least in a region around a magnetic center of the magnet coil system with interruptions running in a longitudinal direction of the bore.

12. NMR measuring arrangement according to claim 1, wherein the heat sink, to which at least the length of the segment of the bore wall is thermally coupled,
is a nitrogen container of the cryostat or a radiation shield of the cryostat connected to the nitrogen container, or
is a warmer cooling stage of a cryocooler or a radiation shield connected to the warmer cooling stage of the cryocooler, or
is a radiation shield which is cooled by evaporating helium from a cryogenic container, wherein the cryogenic container is arranged in the vacuum container and contains the magnet coil system.

13. NMR measuring arrangement according to claim 1, wherein at least the length of the segment of the bore wall is thermally coupled to
at least part of the NMR probe, and/or
a gradient coil system which is arranged separately from the probe or as part of the probe in the bore, and/or
a shim coil system which is arranged separately from the probe or as part of the probe in the bore.

14. NMR measuring arrangement according to claim 1, wherein the length of the segment of the bore wall extends in a longitudinal direction of the bore at least over a length of an active region of the RF coil system.

15. NMR measuring arrangement according to claim 1, wherein the length of the segment of the bore wall extends in a longitudinal direction of the bore at least over a length of the magnet coil system.

16. Method for operating the NMR measuring arrangement according to claim 1, comprising: carrying out an NMR measurement on a measurement sample arranged in the NMR probe, during the NMR measurement, cooling at least the segment of the bore wall to a temperature $T_{wall}$ <250K, and, at least in the region of the segment, either evacuating the bore or filling the bore with a dry gas or flushing the bore with the dry gas.

17. Method according to claim 16, further comprising cooling at least part of the NMR probe during the NMR measurement by thermally coupling the NMR probe to at least the segment of the bore wall.

18. Method according to claim 16, wherein at least part of the NMR probe is cooled by a cooling device incorporated into the NMR probe, wherein at least the segment of the bore wall limits an input of thermal radiation into the NMR probe.

19. Method for operating the NMR measuring arrangement according to claim 3, comprising replacing a spent NMR probe with a replacement NMR probe in the NMR measuring arrangement, said replacing comprises removing the spent NMR probe from the bore, discharging the spent NMR probe through the lock chamber, introducing the replacement NMR probe through the lock chamber, and at least partially inserting the replacement NMR probe into the bore, while maintaining a vacuum or a dry gas filling in the bore at least in the region of the segment of the wall of the bore.

20. Method for operating the NMR measuring arrangement according to claim 6, comprising replacing a spent NMR probe with a replacement NMR probe in the NMR measuring arrangement, said replacing comprises removing the spent NMR probe from the bore and at least partially inserting the replacement NMR probe into the bore, while flushing the bore at least in the region of the segment with a dry gas, with the dry gas flushing device.

21. Method for operating the NMR measuring arrangement according to claim 7, comprising replacing a spent NMR probe with a replacement NMR probe in the NMR measuring arrangement, wherein said replacing comprises removing the spent NMR probe from the bore and at least partially inserting the replacement NMR probe into the bore, while heating the bore with the heating device at least in a region of the segment, whereby a formation of condensation is avoided on the bore wall.

* * * * *